United States Patent [19]

Huggins et al.

[11] Patent Number: 4,554,078

[45] Date of Patent: Nov. 19, 1985

[54] METHODS OF AND APPARATUS FOR EFFLUENT DISPOSAL

[75] Inventors: Ronald G. Huggins, Lawrenceville; William D. O'Brien, Jr., Lilburn; Fred P. Partus, Marietta, all of Ga.

[73] Assignee: AT&T Technologies, Inc., New York, N.Y.

[21] Appl. No.: 612,501

[22] Filed: May 21, 1984

[51] Int. Cl.[4] .............................................. B01J 14/00
[52] U.S. Cl. .................................... 210/749; 210/752; 210/754; 210/150; 210/199; 210/206; 422/211; 422/194; 422/231
[58] Field of Search ...................... 65/3.12, 11, 12, 16, 65/32, 157; 210/749–751, 752, 753, 198.1, 199, 150, 205, 206, 754; 261/94, 123; 422/211, 230, 231, 194; 423/92–94, 96, 300, 304, 325, 341

[56] References Cited

U.S. PATENT DOCUMENTS

| | | | |
|---|---|---|---|
| 3,069,281 | 12/1962 | Wilson | 106/300 |
| 3,078,148 | 2/1963 | Belknap et al. | 423/613 |
| 3,297,411 | 1/1967 | Dear | 422/158 |
| 3,723,545 | 3/1973 | Nagel et al. | 261/123 |
| 3,735,000 | 5/1973 | Calcagno et al. | 423/613 |
| 3,794,299 | 2/1974 | Wagner et al. | 210/198.1 |
| 4,018,867 | 4/1977 | Lee | 423/115 |
| 4,113,438 | 9/1978 | Brooks et al. | 422/230 |
| 4,138,330 | 2/1979 | Garrett | 210/750 |
| 4,217,027 | 8/1980 | MacChesney et al. | 65/18 |
| 4,231,777 | 11/1980 | Lynch et al. | 65/109 |
| 4,289,731 | 9/1981 | Khmelevskaya et al. | 422/231 |
| 4,357,309 | 11/1982 | Arnold et al. | 422/231 |
| 4,440,558 | 4/1984 | Nath et al. | 65/157 |

Primary Examiner—Peter Hruskoci
Attorney, Agent, or Firm—E. W. Somers

[57] ABSTRACT

An open end (61) of a tube (62) is disposed below a free surface of a treating solution (60) which is capable of reacting with a liquid effluent to provide a disposable reaction product. A pressurized gas which is non-reactive with the effluent and with the treating solution causes the effluent to be moved through the tube and discharged into contact with the treating solution. Also, the gas is flowed through a shroud (63) disposed concentrically about the tube. The gas envelops the effluent and the shroud prevents contact of the treating material with the effluent and the gas along a predetermined distance beyond the open end of the tube. This arrangement causes the treating material to react with the effluent at a location spaced from the end of the tube thereby preventing clogging of the tube. The discharge of the gas along with the liquid effluent into the treating solution causes a substantial mixing of the two liquids to provide a substantially complete reaction.

13 Claims, 6 Drawing Figures

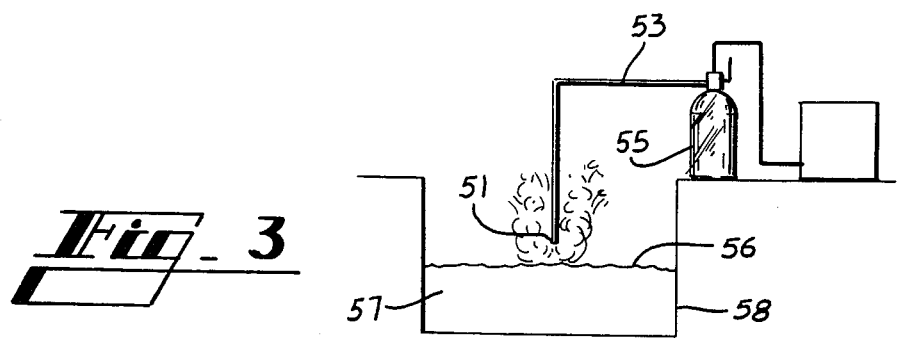
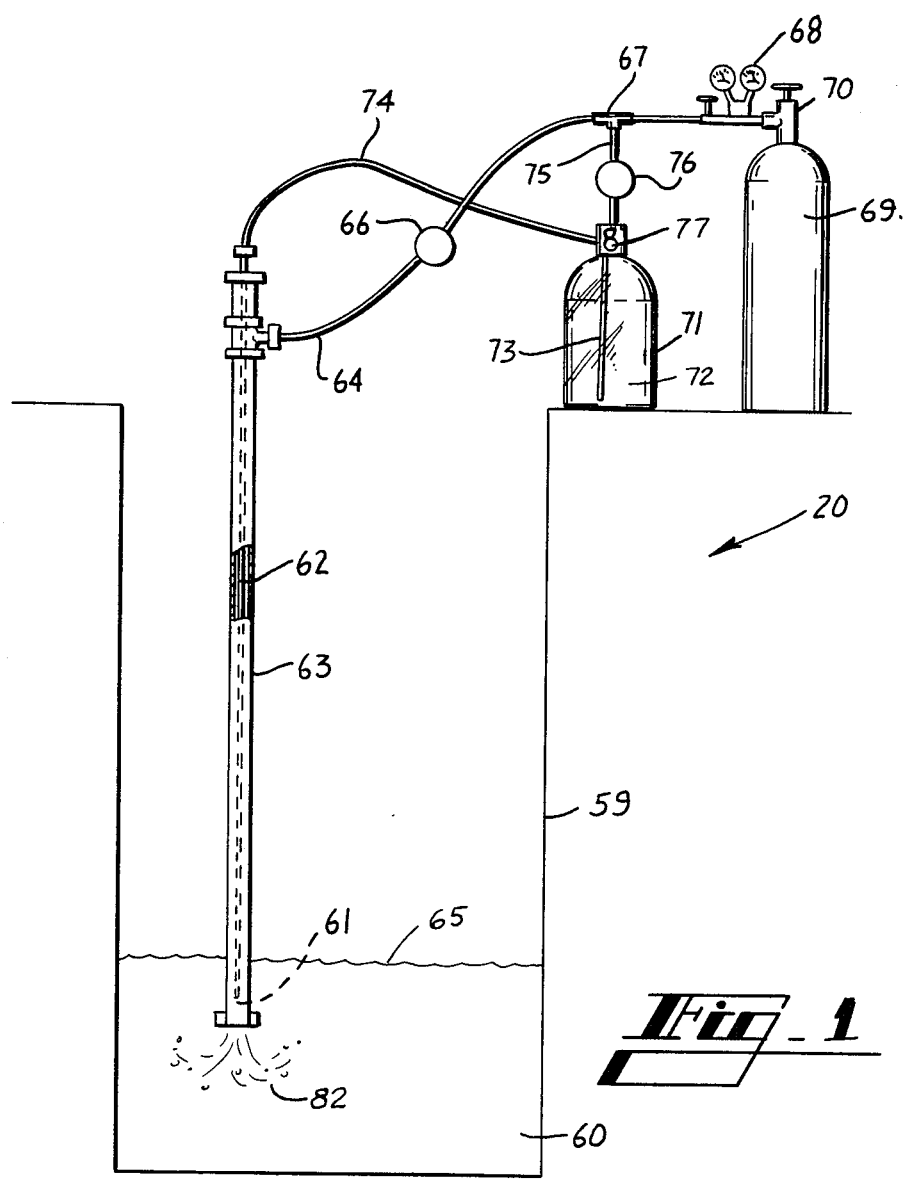

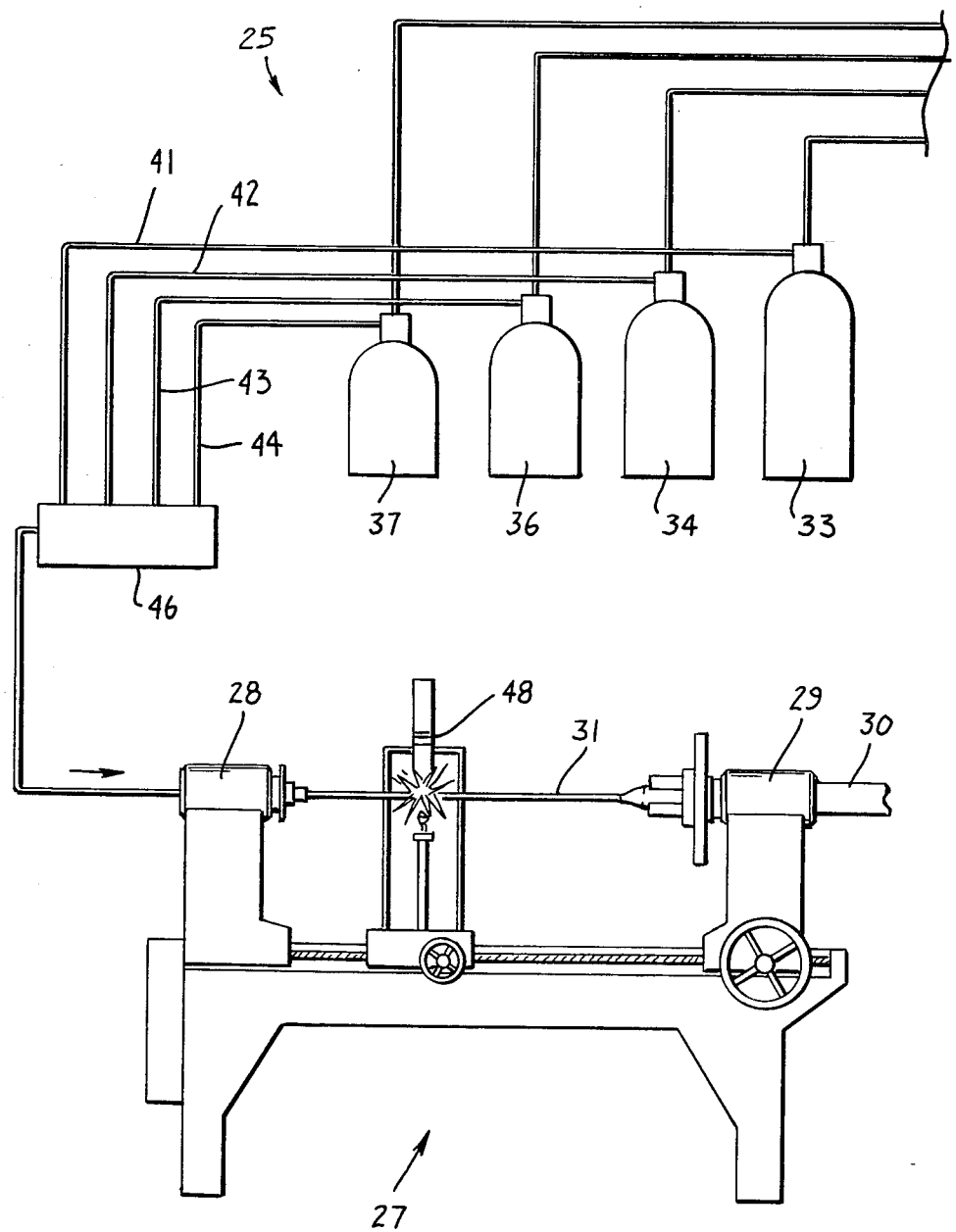
Fig_2

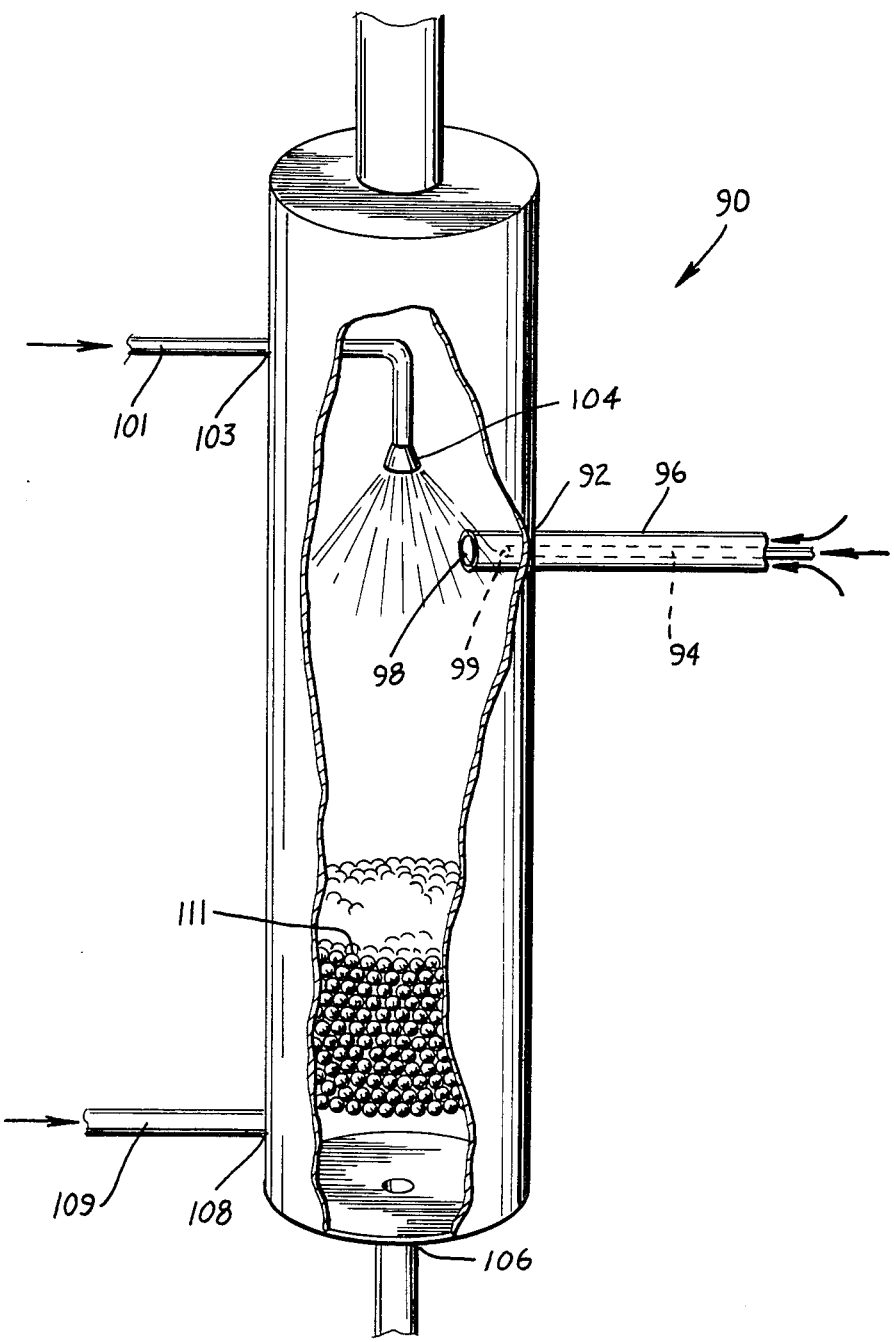
Fig_6

METHODS OF AND APPARATUS FOR EFFLUENT DISPOSAL

TECHNICAL FIELD

This invention relates to methods of and apparatus for effluent disposal. More particularly, it relates to methods of and apparatus for disposing of air-reactive materials from processes which are used to produce preforms from which optical fiber is drawn.

BACKGROUND OF THE INVENTION

The use of optical fiber communication systems has increased significantly during the last few years. It appears likely that the use of this mode of communications will continue to increase in the future. Companies engaged in the manufacture of components for these systems continue to seek ways to reduce the cost thereof and to handle efficiently materials involved in the production thereof.

Presently, optical fibers are being manufactured in processes which include the reaction of a silicon-containing gas or vapor and the reaction of germanium-containing gas or vapor to form a deposited glass having suitable optical properties. These properties are used to fabricate preforms which is the first step in making lightguide fibers. One such process which is known as a modified chemical vapor deposition (hereinafter MCVD) process is described in J. B. MacChesney "Materials and Processes for Preform Fabrications—Modified Chemical Vapor Deposition", Vol. 64, proceedings of IEEE, pages 1181–1184(1980).

Input to the MCVD process may comprise oxygen as a carrier gas and reactive vapors such as germanium tetrachloride ($GECl_4$), silicon tetrachloride ($SiCl_4$) and phosphorous oxychloride ($POCl_3$). These reactant vapors which are supplied from bubblers are passed through a glass tube which is referred to as a preform and which is heated to a temperature in the range of 1600° to 1800° C. by an oxyhydrogen torch.

The above-identified materials which include silicon tetrachloride, germanium tetrachloride, and phosphorous oxychloride and which are supplied through bubblers of the MCVD process apparatus to provide reaction products within the preform may become contaminated. This may occur, for example, during transfer into the apparatus. Also, they may become contaminated with moisture in the bubblers because of leaks in the MCVD apparatus such as through defective valves. Further, at times, the materials which are received for use in the MCVD process have been found to be impure.

The supply materials which require disposal react with hydrogen-containing materials to provide undesirable reaction products. They may be referred to as air-reactive materials inasmuch as they tend to form undesirable vapors when they contact the air because of the moisture therein. Consequently, contaminated supply materials must be treated to prepare them for disposal.

In the past, the disposal of supply materials from the MCVD process has been tried with an arrangement in which contaminated liquid material within a container is moved through a tube and discharged at a point just above a treating solution. The treating solution reacted with a supply material to provide disposable reaction products, but as the material was discharged from the end of the tube, undesirable acidic vapors were formed.

Another problem occured in that the reaction products of the effluent materials and the air contacted the discharge end of the tube and formed a blockage, creating the possibility of rupture of the container. This problem is alleviated somewhat by submerging the discharging end of the tube below the free surface of the treating solution. However, the discharge of the liquid effluent into the treating solution does not result in a complete mixing and reaction and some vapors are given off. Also, it would be unwise to hold the end of the tube in the solution inasmuch as the treating solution includes a hydrogen-containing material and the reaction products of it and the effluent would clog the discharge end of the tube.

Seemingly, the prior art does not include methods or apparatus for the successful disposal of liquid supply effluents which react with hydrogen-containing materials. The sought-after solution to this problem should be one which not only a economically feasible, but also one which does not create a hazardous work environment. Further, while in large manufacturing facilities, germanium may be recovered from the MCVD process, in smaller installations, the germanium as well as the other materials may require disposal. Accordingly, the sought-after solution also should be capable of preparing germanium as well as the other materials for disposal.

SUMMARY OF THE INVENTION

The foregoing problem has been overcome by the methods and apparatus of this invention. A treating material which is capable of reacting with the effluent to provide a disposable product is provided. Effluent in liquid form is subjected to a pressurized gas which is non-reactive with the effluent and the treating material to cause the effluent to be moved through a tube and to be discharged along a path from an open end of a tube into contact with the treating material. The gas which causes the effluent to be moved through the tube is caused to envelop the effluent being discharged along the path for a predetermined distance from the end of the tube. The gas and the effluent are shielded from the treating material within the predetermined distance. This arrangement is effective in preventing reaction products of the effluent and the treating material from contacting the tube. Also, the discharge of the gas into contact with the treating material results in a substantial mixing of the treating material and the effluent to cause the reaction therebetween to be substantially complete. Advantageously, bubbles which are generated increase the area of the effluent which is contacted by the treating material and cause the reaction which provides the disposable product to be highly efficient.

In a preferred embodiment, an effluent in liquid form is directed along an inner tube to a point below the free surface of a neutralizing solution where the pressure exceeds atmospheric. A gas which is non-reactive with the effluent and the treating material is moved along an annular flow passage between the inner tube through which the effluent is flowed and a wall of an outer tube. Backflow of the gas into the inner tube is prevented by causing the pressure of the gas to be less than that of the liquid effluent. The outer tube and the gas create a shielded envelope about an open end of the inner tube and the discharging effluent to prevent reaction products of the effluent and neutralizing solution from contacting and clogging the end of the tube. The discharge of the gas into the treating solution causes bubbles comprising the gas and the effluent to be formed. As a result, there is substantial mixing between the effluent and the neutralizing solution and substantial area of the effluent is contacted by the treating solution in a pocket formed in the treating solution adjacent to the open end of the tube. This allows the effluent to react substantially completely below the free surface within the neutralizing solution and avoids the evolution of undesirable vapors.

In another embodiment, the effluent is discharged from a tube and enveloped by a gas for a predetermined distance before it is contacted by a spray comprising a treating material. A shield prevents contact of the effluent and gas by the spray along the predetermined distance. The envelope of gas and the shield prevent contact of the effluent by air prior to its reaction with the treating material of the spray.

BRIEF DESCRIPTION OF THE DRAWINGS

Other features of the present invention will be more readily understood from the following detailed description of specific embodiments thereof when read in conjunction with the accompanying drawings, in which:

FIG. 1 is a schematic view of a system of this invention for treating process effluents to provide disposable materials;

FIG. 2 is a partially schematic view of a portion of an apparatus for making optical preforms;

FIG. 3 is a schematic view of a prior art system for disposing of process effluents;

FIG. 6 is a perspective view of an alternative embodiment of the apparatus of FIG. 1.

DETAILED DESCRIPTION

Figure 4:
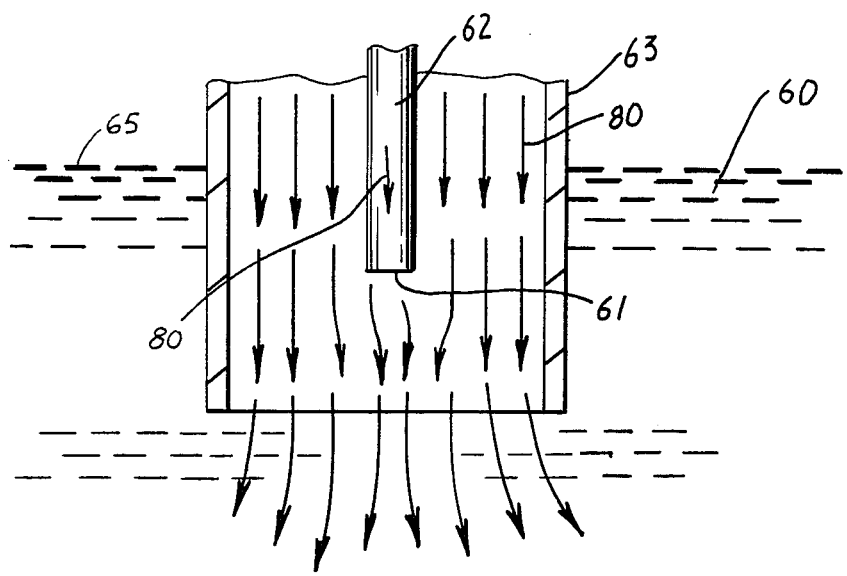
FIG. 4 is a detail view of a portion of the system of FIG. 1.

Referring now to FIG. 1, there is shown a schematic of apparatus designated 20 for treating the effluents of an optical fiber manufacturing process such as MCVD. The MCVD process is fully described in U.S. Pat. No. 4,217,027 which issued on Aug. 12, 1980. The effluents which are treated with the methods and apparatus of this invention react with hydrogen-containing materials such as aqueous solutions or moist air. The methods and apparatus of this invention are capable of being used to provide disposable reaction products.

In FIG. 2 there is shown a portion of an MCVD apparatus 25 for manufacturing an optical preform from which lightguide fiber is drawn. The apparatus comprises a lathe 27 which includes a headstock 28 and a tailstock 29. A substrate tube 31 is supported rotatably between the headstock and the tailstock. Materials for reaction and deposition are moved into the substrate tube from the headstock end and effluents are exhausted through a line 30 from the tailstock end. The materials include silicon tetrachloride, germanium tetrachloride, phosphorous oxychloride and carbon tetrachloride which are flowed from containers 33, 34, 36 and 37, respectively, through lines 41, 42, 43 and 44 to a mass flow control valve 46. The reactions and deposition occur as the substrate tube 31 is traversed by a moving hot zone provided by a torch assembly 48. See U.S. Pat. No. 4,231,777 which issued Nov. 4, 1980 in the names of B. Lynch and F. P. Partus.

The silicon tetrachloride, germanium tetrachloride and phosphorous oxychloride which are supplied in glass containers for use in the MCVD process are such that they react with hydrogen-containing materials. Prior to being used with the MCVD apparatus, these materials are purified. However, as these materials are transferred to the MCVD apparatus, contamination may occur because of leaks, for example, in the apparatus. Also, as the MCVD process is continued, the materials in these containers may become contaminated. The containers may be removed and the materials prepared for disposal or the containers may be pressurized to transfer all materials therein to other containers. In either event, the effluents in the containers are treated by the methods and apparatus of this invention.

If as in the prior art arrangement shown in FIG. 3, an open end 51 of a discharge tube 53 from a container 55 which holds the effluent is spaced above a free surface 56 of a relatively high pH neutralizing solution 57 in a tank 58, the effluent reacts with the ambient environment to produce undesirable gases. Effluents which include silicon tetrachloride, germanium tetrachloride and phosphorous oxychloride react with the atmosphere to provide reaction products which include acidic vapors. This may be avoided by positioning the discharge end 51 of the tube 53 below the free surface of the solution. However, reaction products caused by the engagement of the effluents clog the open end 51 of the discharge tube 53.

These problems have been overcome by the methods and apparatus of this invention in which the location of the reaction of the effluent and a treating material is controlled to prevent contact of reaction products with the discharge tube. In a preferred embodiment to be described, this is accomplished by using an envelope which includes a gas that is non-reactive with the effluent and with a treating material for the effluent. For simplicity, this gas is referred to hereinafter as a non-reactive gas. The non-reactive gas may be argon and in a preferred embodiment is nitrogen.

As can be observed from FIG. 1, a tank 59 is used to hold a treating material which in this embodiment is a treating solution such as a neutralizing solution 60, for example. The neutralizing solution has a relatively high pH value in the range of 12–13. It may comprise sodium hydroxide, for example. The sodium hydroxide reacts with the silicon tetrachloride to provide sodium chloride and silicon dioxide, with the phosphorous oxychloride to provide sodium chloride and phosphorous-containing compounds and with the germanium tetrachloride to provide sodium chloride and germanium dioxide, all of which reaction products are disposable.

A discharge end 61 of an inner tube or conduit 62 is spaced above a lower end of an outer tube 63. The outer tube is referred to as a shroud. In a preferred embodiment, the tube 63 has an outer diameter of 0.375 inch, and the inner tube 62, an outer diameter of 0.25 inch. Further, as can be seen in FIG. 1, the open end 61 of the tube 62 and the lower end of the shroud 63 are positioned below a free surface 65 of the neutralizing solution 60. The shroud 63 is connected along a line 64 through a valve 66 and coupling 67 to a regulator valve 68 and a valve 70 of a tank 69 of non-reactive gas such as nitrogen, for example.

Also, as can be seen in FIG. 1, the apparatus 20 includes a container 71. The container 71 holds a liquid effluent material 72 such as silicon tetrachloride, for example, which requires disposal but which is treated first in accordance with the methods and apparatus of this invention. Extending into the tank 59 is the inner tube 62 which is connected to the container 71. A dipstick 73 extends toward the bottom of the container 71 and is connected by a line 74 to the inner tube 62. Pressurized non-reactive gas from the tank 69 is supplied to the container 71 through a line 75 that is connected to the coupling 67 and through a valve 76. The container 71 also includes a valve 77 which is connected to the lines 74 and 75 and which is used to direct the gas either into the line 74 or into the container.

At the beginning of the operation, the non-reactive gas is caused to flow through portions of the apparatus. It is flowed along the line 64 and into the shroud 63. Also, the valve 76 is opened and the valve 77 is positioned to allow the gas to flow along the line 74 and through the inner tube 62. Then the inner tube 62 and shroud 63 are moved to cause the lower ends thereof to be submerged below the free surface 65 of the treating solution 60 (see FIG. 4). The gas flows into the solution 60 and buffers the end of the inner tube 62 from the solution and maintains the solution spaced from the end 61 of the tube (see FIG. 4). The pressure at the outlet of the regulator valve 68 preferably is in the range of 5 to 10 psi. Then the valve 77 is turned to allow the non-reactive gas to enter the container 71 and cause the liquid process effluent 72 to be moved upwardly through the dipstick 73, the line 74 and into the inner tube 62. Because the pressure of the effluent at the discharge end 61 of the tube 62 is at least equal to that of the non-reactive gas, there is no backflow of the non-reactive gas upwardly into the inner tube. The pressure at the discharge end 61 of the inner tube 62 includes not only the pressure of the non-reactive gas but also the static head of the effluent between the top of the shroud 63 and the discharge end 61 of the inner tube. After the container 71 has been emptied, the tube 62 and shroud 63 are removed from the tank 59 and the gas flow is then discontinued.

The non-reactive gas is used not only to pump the liquid effluent material to the tank 59 but also to cooperate with the shroud 63 to provide a shielded envelope of gas about the discharge end 61 of the tube 62. Viewing FIG. 5 in particular, it can be seen that the non-reactive gas flows along streamlines 80-80. These streamlines adjacent to the open end 61 of the inner tube 62 form an envelope about the effluent emerging from the inner tube. As a result, the non-reactive gas which is moved through the shroud 63 encloses the discharge end 61 of the tube 62 and provides a buffer zone 79 of non-reactive gas between the discharge end of the tube and the lower end of the shroud.

Figure 5:
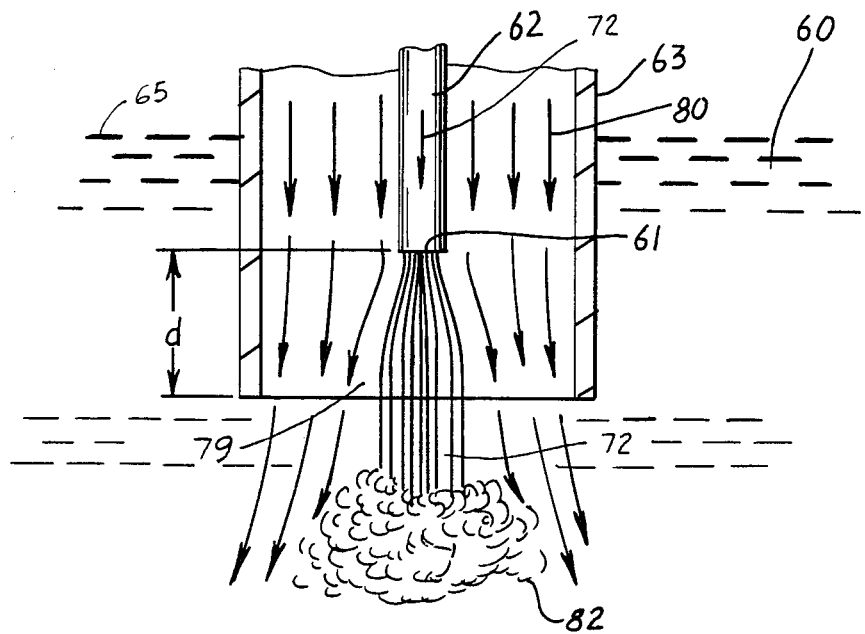
FIG. 5 is a view of the portion of the system of FIG. 4 to show the flow of an effluent into a treating material.

Viewing again FIG. 5, it can be seen that the discharge end 61 of the tube 62 is recessed a predetermined distance "d" within the lower end of the shroud 63. In a preferred embodiment, this distance is six inches. The distance "d" between the discharge end 61 of the inner tube 62 and at the end of the shroud 63 affects the geometry of the discharged liquid effluent stream. As "d" decreases, the effluent discharged from the inner tube 62 tends to spread out. This occurs because there is insufficient length for the zone 79 to develop before it contacts the neutralizing solution 60.

The shroud 63 shields the gas and the effluent and is effective to prevent contact of the treating material with the gas and with the effluent along the predetermined distance. The envelope is effective to maintain the neutralizing solution 60 spaced the predetermined distance "d" from the end 61 of the tube 62. The effluent tunnels through the buffer zone 79 of the non-reactive gas until it contacts the solution to provide a reaction product which is disposable. Advantageously, the shielded envelope gas maintains the location of the reaction of the effluent with the solution spaced from the discharge end 61 of the inner tube 62. As a result, the end 61 of the tube 62 does not become clogged by reaction products of the effluents and the treating material as it did in the past.

The discharge of the non-reactive gas into the body of a treating solution creates a pocket 82 beneath the free surface 65 thereof in which the reaction between the effluent and the treating solution occurs. The turbulence created by the discharge of the effluent and the non-reactive gas into the treating solution causes substantial mixing of the effluent with the treating solution. As a result, the reaction between the treating solution and the effluent is caused to be substantially complete. The discharge of the non-reactive gas into the treating solution also causes bubbles to form. Substantial area of the effluent is exposed to the treating solution and the reaction between the two is relatively efficient. Because of the completeness of the reaction between the effluent and the treating solution, the discharge of undesirable vapors into the atmosphere is avoided.

It should be apparent that the above-described arrangement can also be used with the exit end 61 of the tube 62 being substantially at the free surface 65 of the treating solution or slightly thereabove. In that event, the effluent is discharged into a solution substantially at atmospheric pressure. In the preferred embodiment which is shown in FIG. 1, the effluent is discharged into a body of treating solution at a location where the pressure is greater than atmospheric pressure. The farther the end 61 of the tube 62 is immersed into the treating solution and the greater the hydrostatic pressure, the more dwell time there is for the effluent to react with the treating solution and hence the more complete is the reaction between the two.

Should a liquid be discharged into a liquid without the gas envelope, the reaction is concentrated in the vicinity of the tube end and consumes the treating solution thereabout. As a result, some of the reaction products come out of the liquid phase and evolve as undesirable vapors. Of course, the tube end could be moved farther into the treating solution, but the problem of clogging still exists.

Advantageously, the gas drives the reaction farther into the solution. This prevents contact of the reaction products with the end of the tube 61 and causes the reaction to have more dwell time beneath the surface of the treating solution. This enhances the reaction and makes it more complete thereby avoiding the discharge of any undesirable vapors.

In an alternative embodiment, the effluent and gas are discharged into contact with a liquid spray. As in the case of the preferred embodiment shown in FIG. 1, the liquid spray provides substantially more surface area than would be accomplished with the effluent being discharged into contact with another liquid stream. As a result, the reaction process between the effluent and the neutralizing solution is highly efficient.

Shown in FIG. 6 is such an alternative embodiment for providing disposable materials. A cylindrically shaped scrubber 90 includes an entry port 92 for effluents. The effluent is fed into the scrubber 90 along a discharge conduit 94. Disposed concentrically about the conduit 94 is a tubular shroud 96 through which a gas which is non-reactive with the effluent and with a treating solution for the effluent is fed. As before, this gas is referred to in the description of this embodiment as a non-reactive gas. As can be seen in FIG. 6, an open end 98 of the shroud 96 extends past an open end 99 of the discharge conduit 94.

Provisions also are made for contacting the effluent material with a neutralizing solution such as, for example, sodium hydroxide which has a relatively high pH value. A supply pipe 101 extends into the scrubber 90 through an opening 103 in a sidewall of the scrubber and terminates in a nozzle 104 which produces a spray to contact the incoming effluent. A lower portion of the scrubber 90 is provided with a drain 106.

The lower portion of the scrubber is adapted to receive another effluent. For this, the scrubber is provided with an inlet 108 for a line 109. The line 109 is connected to a chemical purification system which is not shown and which provides hydrochloric acid gas or chlorine gas. These gases are directed into the bottom of the scrubber 90 and upwardly through a packing 111. The packing 111 comprises a mass of Raschig rings which are made of polyvinyl chloride (PVC) or ceramic material, for example. Each of the rings is such that its inner diameter is equal approximately to the length of the ring.

In the operation of the alternative embodiment, a non-reactive gas is directed through the shroud 96 to create a buffer zone of the gas about the end of the conduit 94. As a result, an effluent which is moved through the conduit 94 is contacted by the spray of neutralizing material adjacent to the open end of the shroud 96 and spaced from the open end of the discharge conduit. The contact of the spray with the effluent results in sodium chloride as a reaction product which gravitates downwardly through the packing 111 to the drain 106.

The effluent is discharged from the conduit 94 along a path which is provided with an envelope. As in the embodiment shown in FIG. 1, the envelope formed by the non-reactive gas prevents the reaction products from contacting the conduit 94 and the shroud 96. The shroud 96 functions as a shield to prevent contact of the effluent and the gas by treating material for a predetermined distance from the end of the conduit 94.

The gas from the purification system is moved upwardly through the packing material 111 and contacts the neutralizing solution. The material in gaseous phase which is introduced at the inlet 108 is converted to a liquid phase as a result of its reaction with the neutralizing solution within the packing material and thereabove. The neutralizing solution emitted by the spray advantageously coats the packing material to provide more surface area for reaction. If the gas from the purification system is hydrochloric acid, it reacts with the neutralizing solution to produce sodium chloride which falls to the drain 106 and is moved to a filtration system (not shown). If it is chlorine gas, it reacts with the sodium hydroxide to form hypochlorite ions which are corrosive and which are recirculated out through the drain 106 and through the scrubber system. In other portions of the system (not shown) hydrogen peroxide is caused to react with the hypochlorite ions to produce chloride ions.

The system shown in FIG. 6 is advantageous from several standpoints. First, it is unnecessary to provide a reservoir of a treating solution. A further advantage occurs because the system is able to combine the function of treating gases from a chemical purification process in the same system which is used to treat effluents from the MCVD process.

The methods and apparatus of this invention provide for the discharge of an effluent and an envelope comprising a non-reactive gas into a fluid at a pressure which is at least atmospheric. In the embodiment depicted in FIG. 6, the effluent is caused to be discharged into a fluid which is at atmospheric pressure and which is subjected to a spray comprising the treating solution. On the other hand, in the embodiment shown in FIG. 1, the effluent is caused to be discharged into a treating solution at a location where the pressure is greater than atmospheric.

It is to be understood that the above-described arrangements are simply illustrative of the invention. Other arrangements may be devised by those skilled in the art which will embody the principles of the invention and fall within the spirit and scope thereof.

What is claimed is:

1. A method of treating a liquid effluent which comprises an air reactive material to provide a disposable material, said method comprising the steps of:

supplying a suitable amount of a solution comprising a treating material which is capable of reacting with the liquid effluent to provide a disposable reaction product;

providing a pressurized gas which is non-reactive with the effluent and the treating material;

subjecting the liquid effluent to a pressure which is at least equal to the pressure of the pressurized gas to cause the effluent to be moved through a tube and to be discharged in a direction along a path from an end of the tube to contact the treating material and react therewith to provide the reaction product; and causing the effluent to contact the treating material at a predetermined distance from the end of the tube in order to prevent the reaction product from contacting the end of the tube by providing an envelope comprising the pressurized gas along the predetermined distance about the effluent being discharged and by shielding the gas envelope from the treating material, the pressure of the gas being sufficient to maintain the treating material spaced from the end of the tube to avoid the evolution of undesirable vapors.

2. The method of claim 1, wherein the gas is flowed in the same direction as is the effluent at the end of the tube.

3. The method of claim 1, wherein the gas is effective to prevent contact of the effluent with air prior to reaction with the treating material.

4. The method of claim 1, wherein the treating material is caused to be sprayed into contact with the effluent as the effluent is discharged from the tube.

5. The method of claim 1, wherein the end of the tube is disposed below a free surface of the treating solution.

6. The method of claim 5, wherein the treating solution is a neutralizing solution which has a relatively high pH value.

7. The method of claim 5, wherein the gas is supplied to provide an annulus about the effluent.

8. The method of claim 7, wherein a distance between the end of the tube and the end of a shroud through which the gas is fed is the predetermined distance and is controlled to control the expansion of the discharge effluent.

9. An apparatus for treating a liquid effluent which comprises an air reactive material to provide a disposable product, said apparatus including:
- means for supplying a suitable amount of a solution comprising a treating material which is capable of reacting with the liquid effluent to provide a disposable reaction product;
- a tube through which the effluent is capable of being moved;
- means for providing a pressurized gas which is non-reactive with the effluent and with the treating material;
- means for subjecting the liquid effluent to a pressure which is at least equal to the pressure of the pressurized gas to cause the effluent to be moved through the tube and to be discharged along a path from an end of the tube to contact the treating material and react therewith to provide the disposable reaction product; and
- means for causing the effluent to contact the treating material at a predetermined distance from the end of said tube to prevent the reaction product from contacting the end of said tube, said causing means including means for causing the gas to envelop the effluent being discharged along the path for the predetermined distance and for shielding the gas envelope from the treating material, the pressure of the gas being sufficient to maintain the treating material spaced from the end of the tube to avoid the evolution of undesirable vapors.

10. An apparatus for providing a disposable material from a liquid effluent which comprises an air reactive material, said apparatus comprising:
- a tank for holding a suitable amount of a neutralizing solution which is capable of reacting with the liquid effluent to provide a disposable reaction product;
- delivery means including a discharge tube for directing the liquid effluent comprising an air reactive material along a path into said tank and into contact with the neutralizing solution at a location below a free surface thereof;
- means for providing a pressurized gas which is nonreactive with the effluent and with the neutralizing solution;
- means for subjecting the effluent to a pressure which is equal at least to the pressure of the pressurized gas to cause the effluent to be flowed through and out of the discharge tube along the path into contact with the neutralizing solution; and
- means for causing the gas to provide an envelope about the effluent for a predetermined distance along the path along which the effluent is discharged to cause the effluent to react with the solution below the free surface thereof and spaced from an end of the discharge tube to provide the disposable reaction product, the pressure of the gas being sufficient to maintain the neturalizing solution spaced from the end of the tube to avoid the evolution of undesirable vapors, said causing means including;
- a shroud which is disposed about said tube and which extends the predetermined distance beyond said tube to prevent contact of the neutralizing solution with the gas and with the effluent within the predetermined distance along the path.

11. An apparatus for disposing of a liquid effluent comprising an air reactive material, said apparatus comprising:
- a chamber;
- conduit means for discharging the liquid effluent and directing it into said chamber;
- means for providing a solution comprising a treating material;
- means for providing a pressurized gas which is non-reactive with the effluent and with the treating material;
- means for causing a zone of the pressurized gas to be disposed about the location at which the effluent is discharged;
- means for subjecting the effluent to a pressure at least equal to that of the pressurized gas to cause the effluent to flow through said conduit means into engagement with and through the zone of gas;
- spray means for directing the liquid treating material into contact with the effluent as the effluent emerges from the zone of gas to cause the treating material to react with the effluent and provide a disposable reaction product; and
- means for shielding the effluent and the gas from the treating material for a predetermined distance from an end of said conduit means, said shielding means and the zone of gas being effective to prevent the reaction product from contacting said conduit means, the pressure of the gas being sufficient to maintain the treating material spaced from the end of the tube to avoid the evolution of undesirable vapors.

12. The apparatus of claim 11, which also includes a drain for collecting the reaction product of the effluent and the treating material and which further includes a packing material disposed between said drain and said conduit means.

13. The apparatus of claim 12, which also includes an inlet disposed between said drain and said packing material and which also includes means for introducing a gaseous effluent through said inlet to react with the treating material.

* * * * *